United States Patent
Wang et al.

(10) Patent No.: US 8,772,125 B2
(45) Date of Patent: Jul. 8, 2014

(54) METHOD OF DOUBLE-SIDED PATTERNING

(71) Applicant: Shanghai Hua Hong Nec Electronics Co., Ltd., Shanghai (CN)

(72) Inventors: Lei Wang, Shanghai (CN); Xiaobo Guo, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 23 days.

(21) Appl. No.: 13/712,059

(22) Filed: Dec. 12, 2012

(65) Prior Publication Data

US 2013/0149836 A1   Jun. 13, 2013

(30) Foreign Application Priority Data

Dec. 12, 2011   (CN) .......................... 2011 1 0412660

(51) Int. Cl.
*H01L 21/76* (2006.01)
(52) U.S. Cl.
USPC .................... 438/401; 257/797; 257/E23.179
(58) Field of Classification Search
CPC ............................... H01L 23/544; H01L 22/00
USPC .......................... 438/401; 257/797, E23.179
See application file for complete search history.

(56) References Cited

U.S. PATENT DOCUMENTS

| 7,977,141 B2* | 7/2011 | Harada et al. .................... 438/69 |
| 2008/0197436 A1* | 8/2008 | Uya ............................... 257/432 |
| 2009/0134496 A1* | 5/2009 | Warrick et al. ................ 257/620 |

* cited by examiner

Primary Examiner — Ha Tran T Nguyen
Assistant Examiner — Aaron Dehne
(74) Attorney, Agent, or Firm — MKG, LLC

(57) ABSTRACT

A method of double-sided patterning including positioning a first silicon wafer with its back side facing upwards and forming one or more deep trenches serving as alignment marks on the back side of the first silicon wafer; performing alignment with respect to the alignment marks and forming a back-side pattern on the first silicon wafer; depositing a polishing stop layer on the back side of the first silicon wafer; flipping over the first silicon wafer and bonding its back side with the front side of a second silicon wafer; polishing the front side of the first silicon wafer to expose the alignment marks from the front side; performing alignment with respect to the alignment marks and forming a front-side pattern on the first silicon wafer; removing the second silicon wafer and the polishing stop layer to obtain a double-sided patterned structure on the first silicon wafer.

11 Claims, 4 Drawing Sheets

METHOD OF DOUBLE-SIDED PATTERNING

CROSS-REFERENCES TO RELATED APPLICATIONS

This application claims the priority of Chinese patent application number 201110412660.7, filed on Dec. 12, 2011, the entire contents of which are incorporated herein by reference.

TECHNICAL FIELD

The present invention relates to the fabrication of microelectronic chips, and more particularly, to a method of forming patterns on both sides of a silicon wafer.

BACKGROUND

In the fabrication of some power devices such as reverse-conductor insulated-gate bipolar transistors (RC-IGBTs), device structures are formed on both the front and back sides of a silicon wafer, which requires the process of double-sided patterning as well as alignment between patterns on the front and back sides of the silicon wafer.

The general practice for achieving the above device structures is one called back-side alignment, for which special lithographic apparatuses and processes are employed. Specifically, in a back-side alignment process, alignment marks are formed on the front side of a wafer, and are taken as alignment references during the back-side lithographic processes. As the silicon wafer is turned upside down when performing back-side alignment, i.e., its front side is facing downwards, a special method is needed to achieve the alignment. According to different light sources adopted, commonly used alignment methods are classified into those adopting infrared light and visible light. Moreover, according to different detecting modes, commonly used detecting methods are classified into reflection detecting and transmission detecting. Currently, all alignment methods adopted in practice are a combination of the above categories.

When infrared light is used, determined by its physical properties, both its reflectivity and transmissivity are affected by characteristics of the wafer and the process, for example, the wafer thickness, doping type and doping concentration of the wafer, and whether the pattern on the front side of the wafer is formed of metal. These will have great impacts on the intensity and signal to noise ratio (SNR) of infrared signals. Therefore, for a determined alignment mode, the process must be carried out in fixed steps, i.e., in which step the back-side lithography should be performed is strictly limited. Meanwhile, extremely high requirements are also imposed on the dopant type and concentration, which will severely limit the properties of the device. As a result, different apparatuses must be employed to produce specific devices with different properties, thus leading to a high production cost of the devices.

On the other hand, when visible light is used, as it cannot pass through a silicon wafer, one can only adopt the reflection type alignment. In such a mode, when performing the back-side lithographic process, the silicon wafer held by a wafer stage must be placed with the back side facing upwards, namely, with the front side where the alignment marks are formed facing downwards and contacting with the wafer stage, and thus holes must be drilled in the wafer stage in order to introduce light into the holes from the back side of the wafer stage. In order to avoid harming the wafer stage's function of holding the silicon wafer by suction, positions and sizes of such holes are limited, thus increasing the complexity of circuit layout design. Further, there are also strict requirements on a protective film that is coated on the front side of the wafer to protect the pattern formed thereon before the wafer is flipped over. For example, in order for visible light to pass through, such film must be transparent and have uniform and stable optical properties.

Overall, because all these methods require expensive special apparatuses and a corresponding specific process, the fabrication cost of this kind of devices has remained high.

Not limited to the above, other back-side processes such as back-side implantation and back-side metallization also require special apparatuses. Therefore, manufacturers have tried to avoid the use of such back-side processes if alternative solutions are available.

In addition, the breakdown voltage of certain types of devices is closely dependent on the thickness of the silicon wafer. Specifically, given the facts that the ratio of breakdown voltage to thickness for silicon is about 10V/μm, and that common consumer-level electronic products have an operating voltage range of 110 volts alternating current (VAC) to 380 VAC and a typical breakdown voltage of about 600 V, silicon substrates for silicon-based integrated devices are generally required to have a thickness of smaller than 100 μm, and typically, from 50 μm to 60 μm. Commonly employed silicon wafer fabrication processes cannot achieve a thickness smaller than 60 μm and must be aided by using carrier substrates, which are thin films commonly made of organic materials, glasses, silicon, metals and the like. Use of such carrier substrates greatly limits subsequent processes. For example, as carrier substrates made of organic materials or glasses cannot be sucked by electrostatic adsorption, when adopting such carrier substrates, all electrostatic adsorption apparatuses throughout the whole production line must be substituted with special suction apparatuses. Moreover, as metals and silicon are opaque materials, no back-side process is applicable when a carrier substrate formed of metal or silicon is applied.

Therefore, there is no effective double-sided patterning method suitable for mass production of thin silicon wafers (i.e., those with a thickness of smaller than 150 μm) at present.

SUMMARY OF THE INVENTION

The present invention addresses the above issues encountered in the prior art by presenting a method of double-sided patterning on silicon wafer. The method is able to greatly reduce the production cost by achieving double-sided patterning without using any special back-side processes or apparatuses, and is compatible with existing thin-wafer processes.

To achieve the above objectives, the method of double-sided patterning provided by the present invention includes the steps of: positioning a first silicon wafer (namely a device wafer) with its back side facing upwards and forming one or more deep trenches on the back side of the first silicon wafer, the one or more deep trenches serving as one or more deep trench alignment marks which can be used in the subsequent lithographic processes consisting of front-side process and back-side process; performing alignment with respect to the one or more deep trench alignment marks and forming a back-side pattern on the back side of the first silicon wafer; depositing a polishing stop layer on the surface of the back side of the first silicon wafer; flipping over the first silicon wafer so as to have its front side face upwards and bonding the back side of the first silicon wafer with a front side of a second silicon wafer (namely a substrate wafer); polishing the front side of the first silicon wafer until a thickness of the first silicon wafer is reduced to a predetermined thickness such that the one or more deep trench alignment marks are exposed from the front side of the first silicon wafer; performing alignment with respect to the one or more deep trench alignment marks and forming a front-side pattern on the front side of the first silicon wafer; polishing a back side of the second silicon wafer until the polishing stop layer is reached; and removing the polishing stop layer so as to obtain a double-sided patterned structure on the first silicon wafer.

According to one embodiment, the one or more deep trenches have a depth greater than the predetermined thickness of the first silicon wafer.

According to another embodiment, the one or more deep trenches are hollow.

According to one embodiment, the one or more deep trenches are filled with a non-metallic inorganic compound of silicon (Si), oxygen (O), nitrogen (N) or carbon (C). Preferably, the material filled in the one or more deep trenches is silicon nitride (SiN), silicon oxynitride (SiON) or silicon dioxide, and more preferably, is silicon dioxide.

According to another embodiment, the one or more deep trenches are filled with aluminum, copper or tungsten.

According to another embodiment, the polishing stop layer is formed of a compound of silicon (Si), oxygen (O), nitrogen (N) or carbon (C). Preferably, the polishing stop layer is formed of silicon nitride (SiN), silicon oxynitride (SiON) or silicon dioxide.

According to another embodiment, the polishing stop layer must fully cover the topography of back-side pattern on the back side of the first silicon wafer; more preferably, the polishing stop layer is formed of silicon dioxide and has a thickness of 100 Å to 10 μm.

The present invention has beneficial effects as follows: achievability of double-sided patterning without using any special back-side processes or apparatus; great reduction of production cost; and compatibility with existing thin-wafer processes.

BRIEF DESCRIPTION OF THE DRAWINGS

The present invention will be described and specified below with reference to accompanying drawings and exemplary embodiments.

DETAILED DESCRIPTION

The present invention is capable of greatly reducing production cost by achieving double-sided patterning without using any special back-side process or equipment, and is compatible with existing thin-wafer processes. By the adoption of certain process steps, same alignment marks are formed on both sides where device fabrication is carried out, thus avoiding the special process of back-side alignment in the prior art.

In summary, the method of the present invention includes the following steps: at first, forming a pattern on the back side of a silicon wafer and simultaneously forming alignment marks etched deep into the silicon wafer; next, forming a stop layer and bonding the silicon wafer with another wafer; after that, polishing the front side of the silicon wafer until the alignment marks are exposed from the front side, such that there are also alignment marks present on the front side; and carry out subsequent steps on the front side with respect to the alignment marks. Then grinding and polishing the back side of the bonded wafers until the stop layer is reached. After all steps on the front side have been completed, removing the stop layer and metalizing the back side of the silicon wafer to obtain a device with both of its sides being patterned and aligned to each other.

As described above, in this method, the back-side pattern is formed prior to the front-side pattern on the wafer. This feature can eliminate the problem of strict requirements on carrier substrate process and thermal budget control in the prior art caused by forming front-side devices first.

Figure 1:
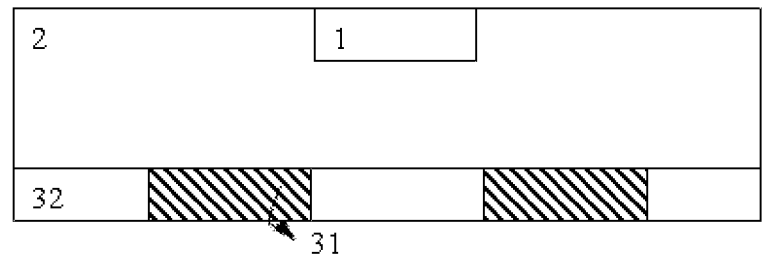
FIG. 1 is a schematic diagram illustrating a double-sided patterned device.

FIG. 1 is a schematic diagram illustrating a target double-sided patterned device. The device has a silicon body region 2, a front side A1 and a back side A2. A front-side pattern 1 is formed on the front side A1, while back-side patterns 31 and 32 are formed on the back side A2. How to obtain the target double-sided patterned device shown in FIG. 1 by using a method of double-sided patterning according to the present invention will be described below with reference to FIGS. 2a to 2h.

Figure 2A:
FIG. 2a is a schematic illustration of a structure formed after alignment marks are formed on the back side of a device wafer.
Figure 2B:
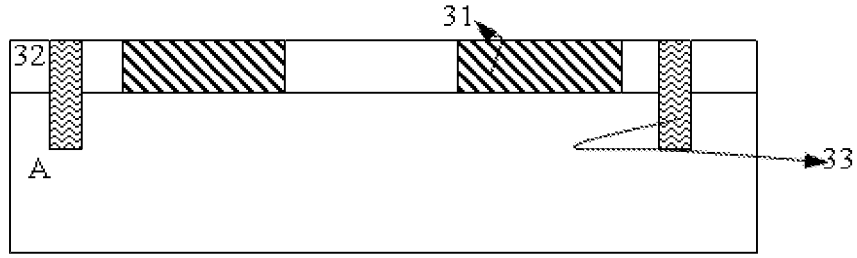
FIG. 2b is a schematic illustration of a structure formed after patterns are formed on the back side of the device wafer.
Figure 2C:
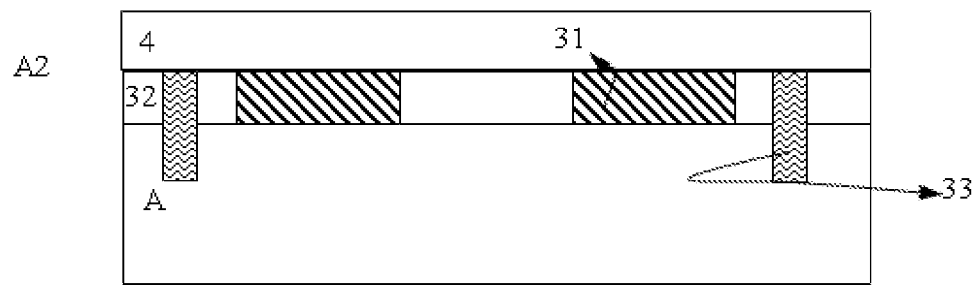
FIG. 2c is a schematic illustration of a structure formed after a stop layer is formed over surface of the back side of the device wafer.
Figure 2D:
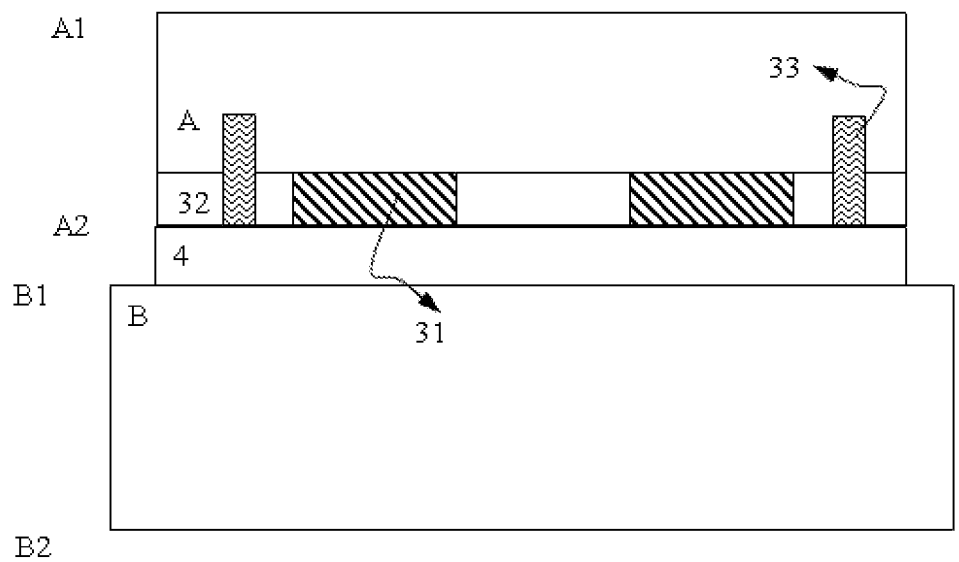
FIG. 2d is a schematic illustration of a structure formed after the device wafer is flipped over and bonded with a substrate wafer.
Figure 2E:
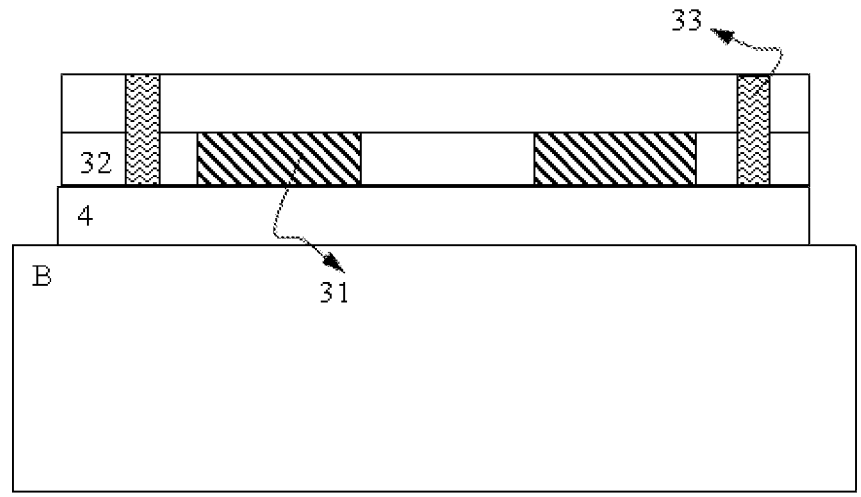
FIG. 2e is a schematic illustration of a structure formed after the front side of the device wafer is thinned and the alignment marks are exposed from the front side.
Figure 2F:
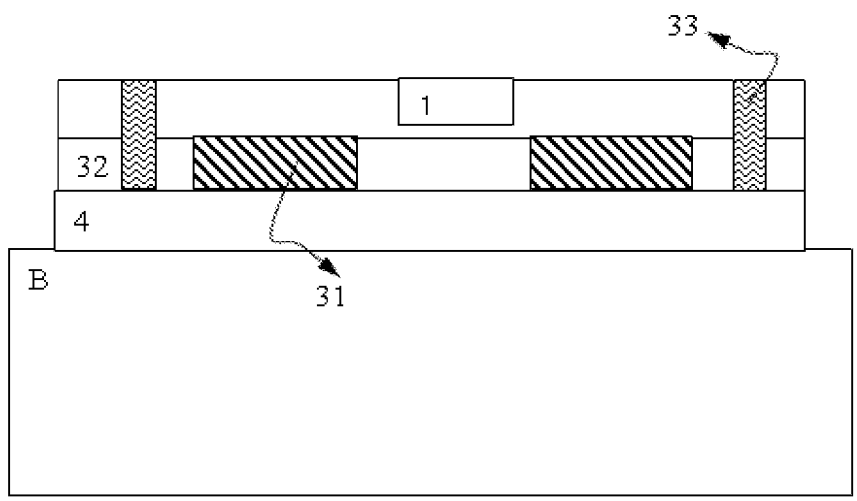
FIG. 2f is a schematic illustration of a structure formed after a front-side pattern is formed by using the deep trench structures as alignment marks.
Figure 2G:
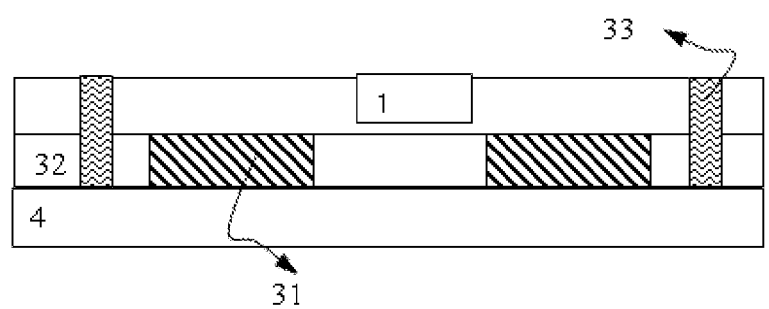
FIG. 2g is a schematic illustration of a structure formed after a back side of the substrate wafer is polished until the stop layer is reached.
Figure 2H:
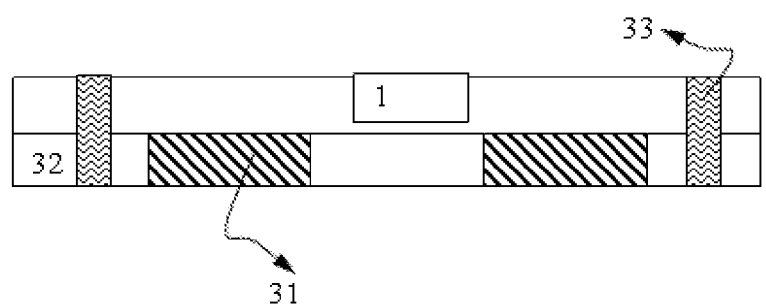
FIG. 2h is a schematic illustration of a final structure formed after the stop layer is removed.

In an embodiment, a first silicon wafer and a second silicon wafer are used in the method of double-sided patterning, the first silicon wafer serving as a device wafer A and the second silicon wafer serving as a substrate wafer B. The method includes the steps of: a) as shown in FIG. 2a, placing the device wafer A with its back side A2 facing upwards and forming deep trench alignment marks 33 on the back side A2, the marks 33 being etched deep into the silicon body region 2; b) as shown in FIG. 2b, performing alignment with respect to the deep trench alignment marks 33 and applying normal semiconductor processes (namely front-side processes) to the back side A2 of the device wafer A to form back-side patterns 31 and 32, the normal semiconductor processes including film-formation, lithography, and implantation or etching; c) as shown in FIG. 2c, depositing a polishing stop layer 4 on the back side A2 of the device wafer A by a normal film-formation process; d) as shown in FIG. 2d, flipping over the device wafer A and bonding the back side A2 of the device wafer A with a front side B1 of the substrate wafer B, such that the bonded wafers is positioned with the front side A1 of the device wafer A facing upwards; e) as shown in FIG. 2e, polishing the front side A1 of the device wafer A until a thickness of the device wafer is reduced to a desired value D2, and at the same time the deep trench alignment marks 33 are exposed; f) as shown in FIG. 2f, performing alignment with respect to the deep trench alignment marks 33 and performing subsequent processes to the front side A1 of the device wafer A so as to form a front-side pattern 1 and thereby complete the front-side structure of the device; g) as shown in FIG. 2g, polishing a back side B2 of the substrate wafer B until the polishing stop layer 4 is reached; and h) as shown in FIG. 2h, removing the polishing stop layer 4 so as to obtain a final device structure.

The present invention will be further specifically described below by taking the formation of a reverse-conductor insulated-gate bipolar transistor (RC-IGBT) as an example, wherein the RC-IGBT has a rated breakdown voltage of 1200 V and a wafer thickness D2 of 80 μm to 100 μm; an IGBT device is formed on its front side, and alternatively arranged P-type and N-type regions are formed on its back side (i.e., beneath the IGBT pattern). The device is fabricated in the following steps:

1. As shown in FIG. 2a, provide a common 725 μm thick device wafer A; turn it upside down such that the back side A2 faces upwards; coat a photoresist thereon and form trench patterns (i.e., alignment mark patterns) in the photoresist by normal lithographic process; and after that, dry etch the device wafer to form trenches with a depth D1 of 100 μm to 150 μm, by using the patterned photoresist as a mask.

2. Further referring to FIG. 2a, fill silicon dioxide into the trenches, followed by surface planarization for removing silicon dioxide deposited on other regions of the wafer surface other than those of the trenches, so as to form deep trench alignment marks 33.

In this step, the deep trenches may also be not filled with any material, leaving the deep trench alignment marks 33 hollow. Or, the trenches may alternatively be filled with a non-metallic inorganic compound of silicon (Si), oxygen (O), nitrogen (N) or carbon (C), and preferably with silicon nitride (SiN), silicon oxynitride (SiON) or silicon dioxide. Or, the trenches may still alternatively be filled with aluminum, copper, tungsten, or other metals.

3. As shown in FIG. 2b, form patterned photoresist on the back side A2 of the device wafer A and thereafter carry out implantation processes to form alternatively arranged P-type and N-type regions 31 and 32, while performing alignments with respect to the alignment marks 33.

4. As shown in FIG. 2c, deposit a silicon dioxide polishing stop layer 4 with a thickness of about 0.2 μm to about 1 μm, wherein the polishing stop layer 4 may alternatively be formed of silicon nitride (SiN) or silicon oxynitride (SiON).

5. As shown in FIG. 2d, flip over the device wafer A and bond its back side A2 (coated with silicon dioxide) with a front side B1 of a substrate wafer B, followed by an annealing treatment for obtaining a certain degree of mechanical bonding strength between the device wafer A and substrate wafer B, wherein the annealing treatment is conducted at a temperature of about 1000° C. to about 130° C. for 1 hours to 12 hours. Herein, if the bonded wafers are regarded as a whole, its front side will be the front side A1 of the device wafer A and its back side will be the back side B2 of the substrate wafer B.

6. As shown in FIG. 2e, polish the front side A1 of the bonded wafers until the thickness of the device wafer A is reduced to a value D2 within the range of 80 μm to 100 μm, which is the thickness range for common devices. Since the alignment marks 33 have a depth D1 greater than the value D2, the alignment marks 33 are exposed from the polished surface after this step. As silicon dioxide filled in the trenches functions as polishing stop layers, the alignment marks are protected from being polished away. And as the front side A1 and the back side A2 of the device wafer share the same alignment marks 33, these marks can serve as reference for all subsequent alignment procedures hereinafter.

7. Optionally, perform a hydrofluoric (HF) acid liquid based wet etching process to the silicon dioxide filled in the trenches to make the level of the surface of the silicon dioxide more than 500 Å lower than the level of the surface of the surrounding silicon, in order to strengthen the effect of the alignment marks.

8. As shown in FIG. 2f, perform subsequent front-side processes, while performing alignments with respect to the alignment marks 33 for both the front and back sides, until all structures of the device have been formed.

9. As shown in FIG. 2f, polish the back side B2 of the substrate wafer B until the silicon dioxide polishing stop layer 4 is reached and thereafter polish the silicon dioxide polishing stop layer 4 until the back side A2 of the device wafer B has been totally exposed.

Normally, the amount of back side grinding of substrate wafer is rather great, the employment of this silicon dioxide stop layer can result in precise controllability of a final vertical thickness of the alternatively arranged P-type and N-type structures formed on the back side and covered by the stop layer.

The present invention is not limited to the embodiments described above, and foregoing description on the specific embodiments is only for describing and specifying the technical scheme of the invention. It will be understood that obviously modifications and variations in light of the above teachings will fall within the scope of the invention. The foregoing specific embodiments are provided to show the best way to carry out the present invention so that one of ordinary skill in the art may use the specific embodiment disclosed, as well as their equivalent constructions, as a basis for achieving the same purposes of the present invention.

What is claimed is:

1. A method of double-sided patterning, comprising, in the following order, the steps of:

positioning a first silicon wafer with its back side facing upwards and forming one or more deep trenches on the back side of the first silicon wafer, the one or more deep trenches serving as one or more deep trench alignment marks which can be used in subsequent lithographic processes consisting of front-side process and back-side process;

performing alignment with respect to the one or more deep trench alignment marks while forming a back-side device structure on the back side of the first silicon wafer;

depositing a polishing stop layer directly on a surface of the back side of the first silicon wafer;

flipping over the first silicon wafer so as to have its front side face upwards and bonding the back side of the first silicon wafer with a front side of a second silicon wafer;

polishing the front side of the first silicon wafer until a thickness of the first silicon wafer is reduced to a predetermined thickness such that the one or more deep trench alignment marks are exposed from the front side of the first silicon wafer;

performing alignment with respect to the one or more deep trench alignment marks while forming a front-side device structure on the front side of the first silicon wafer;

polishing a back side of the second silicon wafer until the polishing stop layer is reached; and removing the polishing stop layer so as to obtain a double-sided patterned structure on the first silicon wafer.

2. The method according to claim 1, wherein the one or more deep trenches have a depth greater than the predetermined thickness of the first silicon wafer.

3. The method according to claim 1, wherein the one or more deep trenches are hollow.

4. The method according to claim 1, wherein the one or more deep trenches are filled with a non-metallic inorganic compound of silicon, oxygen, nitrogen or carbon.

5. The method according to claim 4, wherein the one or more deep trenches are filled with silicon nitride, silicon oxynitride or silicon dioxide.

6. The method according to claim 5, wherein the one or more deep trenches are filled with silicon dioxide.

7. The method according to claim 1, wherein the one or more deep trenches are filled with aluminum, copper or tungsten.

8. The method according to claim 1, wherein the polishing stop layer is formed of a compound of silicon, oxygen, nitrogen or carbon.

9. The method according to claim 8, wherein the polishing stop layer is formed of silicon nitride, silicon oxynitride or silicon dioxide.

10. The method according to claim 9, wherein the polishing stop layer is formed of silicon dioxide and has a thickness of 100 Å to 10 μm.

11. The method according to claim 1, wherein the polishing stop layer fully covers the topography of the back-side device structure on the back side of the first silicon wafer.

* * * * *